US007976206B2

(12) United States Patent
Wu et al.

(10) Patent No.: US 7,976,206 B2
(45) Date of Patent: Jul. 12, 2011

(54) STRUCTURE OF LIGHT BULB

(75) Inventors: Ping-Ju Wu, San Chung (TW); Ping-Chen Wu, San Chung (TW)

(73) Assignee: U-How Co., Ltd., Taipei Hsien (TW)

( * ) Notice: Subject to any disclaimer, the term of this patent is extended or adjusted under 35 U.S.C. 154(b) by 292 days.

(21) Appl. No.: 12/314,794

(22) Filed: Dec. 17, 2008

(65) Prior Publication Data

US 2010/0148650 A1 Jun. 17, 2010

(51) Int. Cl.
*F21V 7/04* (2006.01)
*H01L 33/00* (2010.01)

(52) U.S. Cl. ......................... 362/555; 362/602; 313/315

(58) Field of Classification Search .................. 362/555, 362/551, 558, 602, 600, 257; 313/315, 316, 313/634

See application file for complete search history.

(56) References Cited

U.S. PATENT DOCUMENTS

| | | | | |
|---|---|---|---|---|
| 5,001,609 | A * | 3/1991 | Gardner et al. | 362/555 |
| 5,980,063 | A * | 11/1999 | Ford et al. | 362/186 |
| 6,880,962 | B2 * | 4/2005 | Coushaine et al. | 362/555 |
| 7,160,012 | B2 * | 1/2007 | Hilscher et al. | 362/555 |
| 7,810,974 | B2 * | 10/2010 | Van Rijswick et al. | 362/555 |
| 2004/0109327 | A1 * | 6/2004 | Coushaine et al. | 362/555 |

* cited by examiner

*Primary Examiner* — Bao Q Truong
(74) *Attorney, Agent, or Firm* — Rosenberg, Klein & Lee

(57) ABSTRACT

A light bulb includes a bulb body, a light guide, and at least one light-emitting diode (LED). The bulb body includes a light-transmitting shell and a conductive base. The light-transmitting shell is mounted to the base. A circuit board is fixed at one side of the base and is in electrical connection with the base. The LED is mounted to the circuit board that is arranged at one side of the base, and the LED is in electrical connection with the circuit board to provide an internal light source. The light guide is arranged inside the bulb body and has an end forming a cavity that receives the LED therein, whereby the light guide is set erect on the base. As such, advantages of easy manufacturing, reduced costs, operation safety, increased angular range of illumination, and extended lifespan can be provided.

7 Claims, 6 Drawing Sheets

STRUCTURE OF LIGHT BULB

FIELD OF THE INVENTION

The present invention relates to a structure of a light bulb, and in particular to a light bulb comprising a bulb body inside which a light guide is arranged to guide light from a light-emitting diode for increasing the angular range of illumination and to extend the lifespan thereof for being applicable to lighting in various sites and locations.

BACKGROUND OF THE INVENTION

The conventional incandescent lamps have been widely used. However, the conventional lighting devices suffer certain disadvantages, including high power consumption, which leads to wasting of energy, high heat generation, which may cause burning or damage to surrounding articles and objects, short lifespan, which requires frequent replacement and maintenance, and monotonous outer contours, which lacks sense of art.

Recently, with the costs of raw material increasingly raised and shortage of energy, to reduce waste of energy, the lighting industry are developing power-saving lighting bulb to replace the conventional incandescent bulbs. Further due to the drawback of high heat generation of the conventional incandescent bulbs that causes burning and damage of surrounding articles and objects, the power-saving bulbs are rapidly replacing the incandescent bulbs and become the main stream in the market of lighting instruments. Among the known power-saving lighting devices, light-emitting diodes (LEDs) are now under the quick improvement in luminance and are now widely used in various applications.

However, the lighting offered by the LEDs is subjected to constraint of directionality. The LEDs that are currently available in the market can be roughly divided as three categories, the first being one that is of high directionality and has an angular range of illumination less than 20 degrees, the second being one that is of a standard type and has an angular range of illumination between 20 and 45 degrees, and the third being one that is a diffusive type and has an angular range of illumination greater than 45 degrees. All these LEDs, even the diffusive type, are subjected to a certain extent of limitation in the illumination of light thereof. Thus, to apply LEDs to lighting of various applications without being subjected to such a constraint in the angular range of illumination is now one of the major challenges of the industry.

Thus, the present invention aims to provide a light bulb that offers a reasonable design and effectively overcomes the problems associated with the angular range of illumination.

SUMMARY OF THE INVENTION

A primary objective of the present invention is to provide a light bulb comprising light guide arranged inside a bulb body for guiding light from an internal light source provided by a light-emitting diode (LED) to increase the angular range of illumination thereby enhancing the practicability of the present invention.

Another objective of the present invention is to provide a light bulb comprising a light guide that is subjected to treatments to increase the angular range of illumination thereby enhancing the versatility of the present invention.

A further objective of the present invention is to provide a light bulb comprising an internal light source inside a bulb body provided by an LED, which features operation safety and extended lifespan thereby enhancing the practicability of the present invention.

Yet a further objective of the present invention is to provide a light bulb, which comprises components that can be assembled in a simple process to form a simple structure so that the light bulb can be easily manufactured with reduced costs, thereby enhancing the practicability of the present invention.

To realize the above objectives, the present invention provides a light bulb comprising a bulb body, a light guide, and at least one light-emitting diode (LED). The bulb body comprises a light-transmitting shell and a conductive base. The light-transmitting shell is mounted to the base. A circuit board is fixed at one side of the base and is in electrical connection with the base. The LED is mounted to the circuit board that is arranged at one side of the base, and the LED is in electrical connection with the circuit board to provide an internal light source. The light guide is arranged inside the bulb body and has an end forming a cavity that receives the LED therein, whereby the light guide is set erect on the base. As such, advantages of easy manufacturing, reduced costs, operation safety, increased angular range of illumination, and extended lifespan can be provided.

BRIEF DESCRIPTION OF THE DRAWINGS

The present invention will be apparent to those skilled in the art by reading the following description of preferred embodiments thereof with reference to the drawings, in which.

DETAILED DESCRIPTION OF THE PREFERRED EMBODIMENTS

Figure 1:
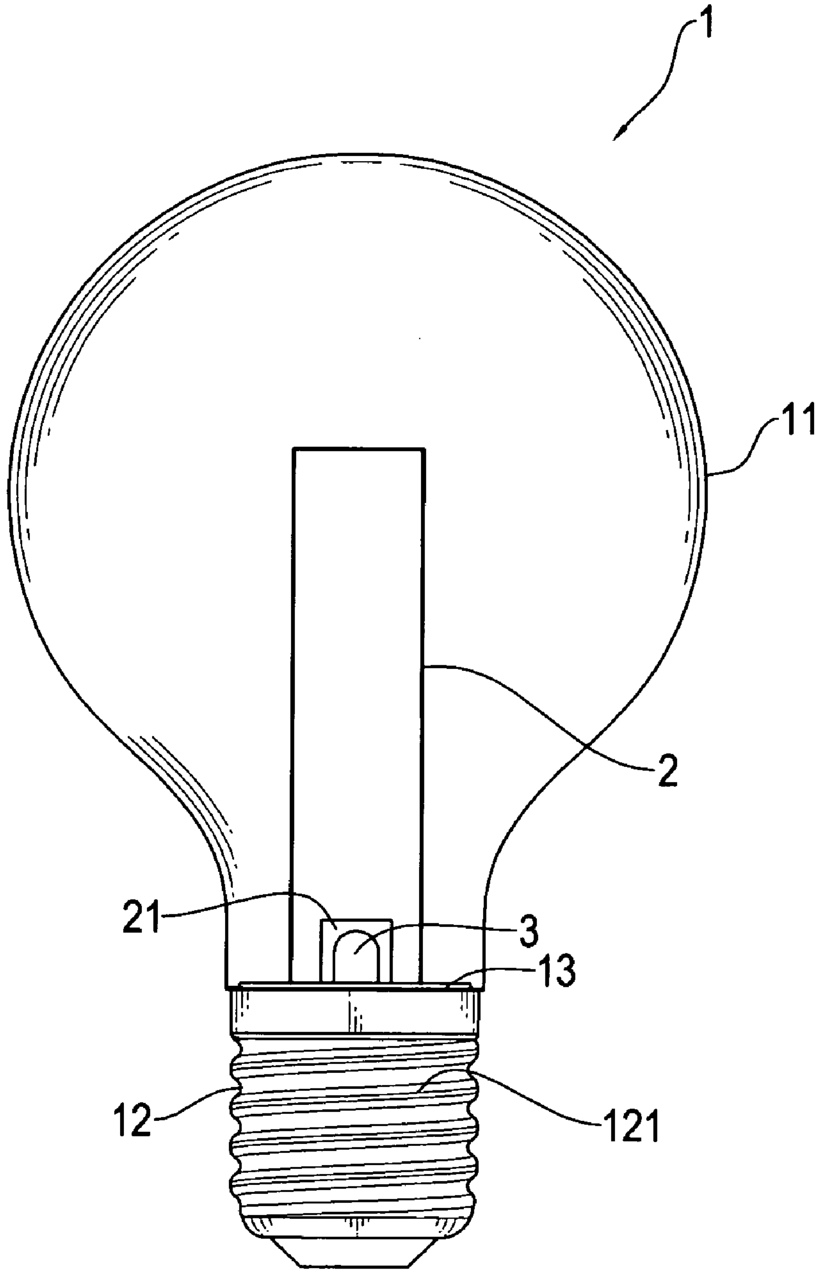
FIG. 1 is a side elevational view showing a light bulb constructed in accordance with a first embodiment of the present invention.
Figure 6:
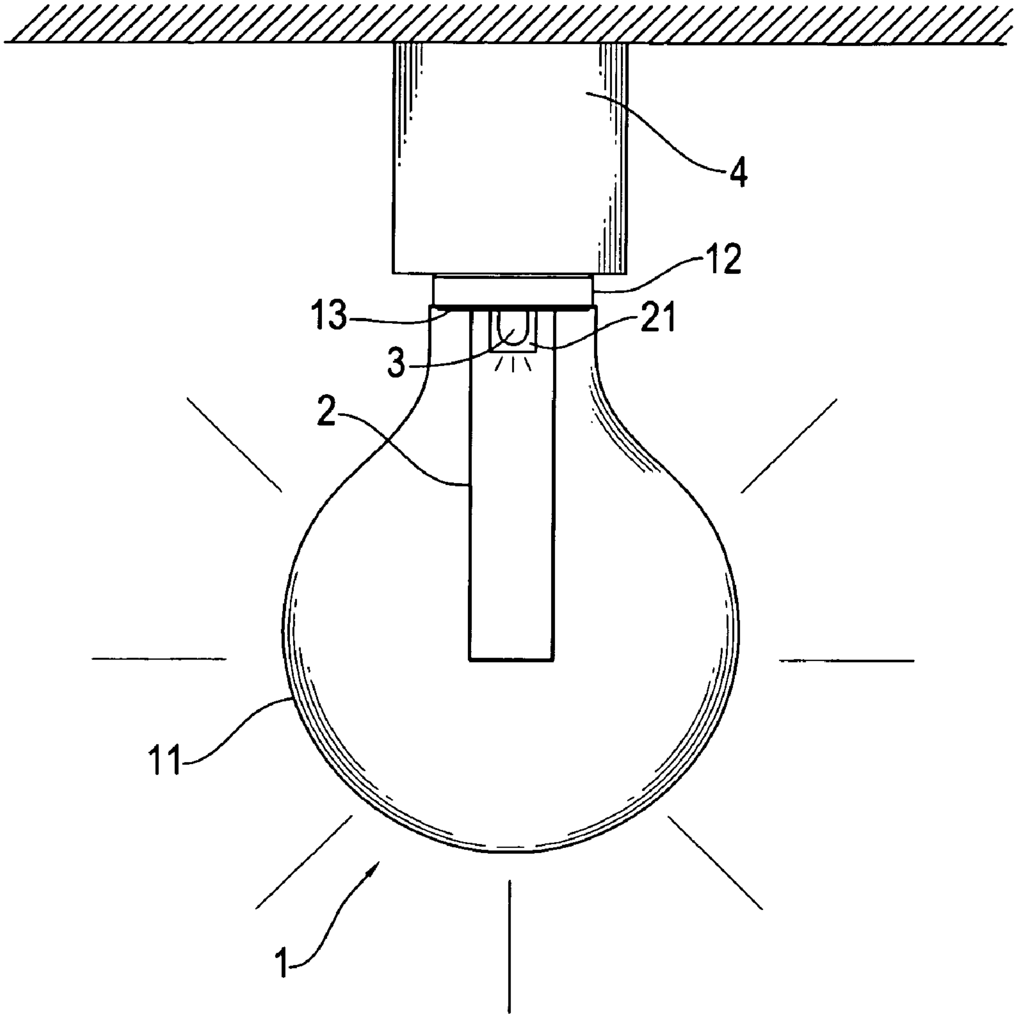
FIG. 6 is a side elevational view illustrating the use of the light bulb in accordance with the first embodiment of the present invention.

With reference to FIGS. 1 and 6, which respectively illustrates a side elevational view of a light bulb constructed in accordance with a first embodiment of the present invention and an application of the light bulb of the present invention, the light bulb of the present invention comprises a bulb body 1, a light guide 2, and at least one light-emitting diode (LED) 3.

The bulb body 1 comprises a light-transmitting material 11, preferably made in the form of a bulb shell, which in the embodiment illustrated comprises clear glass, but can alternatively be clear plastics, frosted glass, or frosted plastics, and an electrically conductive base 12, which in the embodiment illustrated has a helical and electrically conductive configuration 121, comprised of a ring contact and a tip contact, for threading engagement with a socket 4 of an external power source to establish electrical connection therebetween. The light-transmitting material or shell 11 is mounted to the base 12 in order to provide isolation of an internal light source (that is formed by the LED 3) from the surrounding for protection of the internal components, but allowing light to emit outward therethrough. The base 12 is coupled to the external socket 4 to receive electrical power therefrom. A circuit board 13 is fixed at one side (internal side) of the base 12 so that the circuit board 13 is in electrical connection with the base 12.

The LED 3 is mounted to the circuit board 13 that is fixed at one side of the base 12 and forms electrical connection with the circuit board 13 to provide the internal light source for the light bulb. The LED 3 can be a red-light LED, a blue-light LED, or a green-light LED, or a combination of different color LEDs.

The light guide 2, which in the embodiment illustrated comprises an elongate thin cylindrical body, is arranged in an interior space of the bulb body 1. The light guide 2 has an end forming a cavity 21 that receives the LED 3 therein, so that the light guide 2 is set erect on the base 12. With such an arrangement, the light guide 2 guides the light emitting from the internal light source provided by the LED 3 toward the light-transmitting shell 11 to project the light outward through the shell 11.

Figure 2:
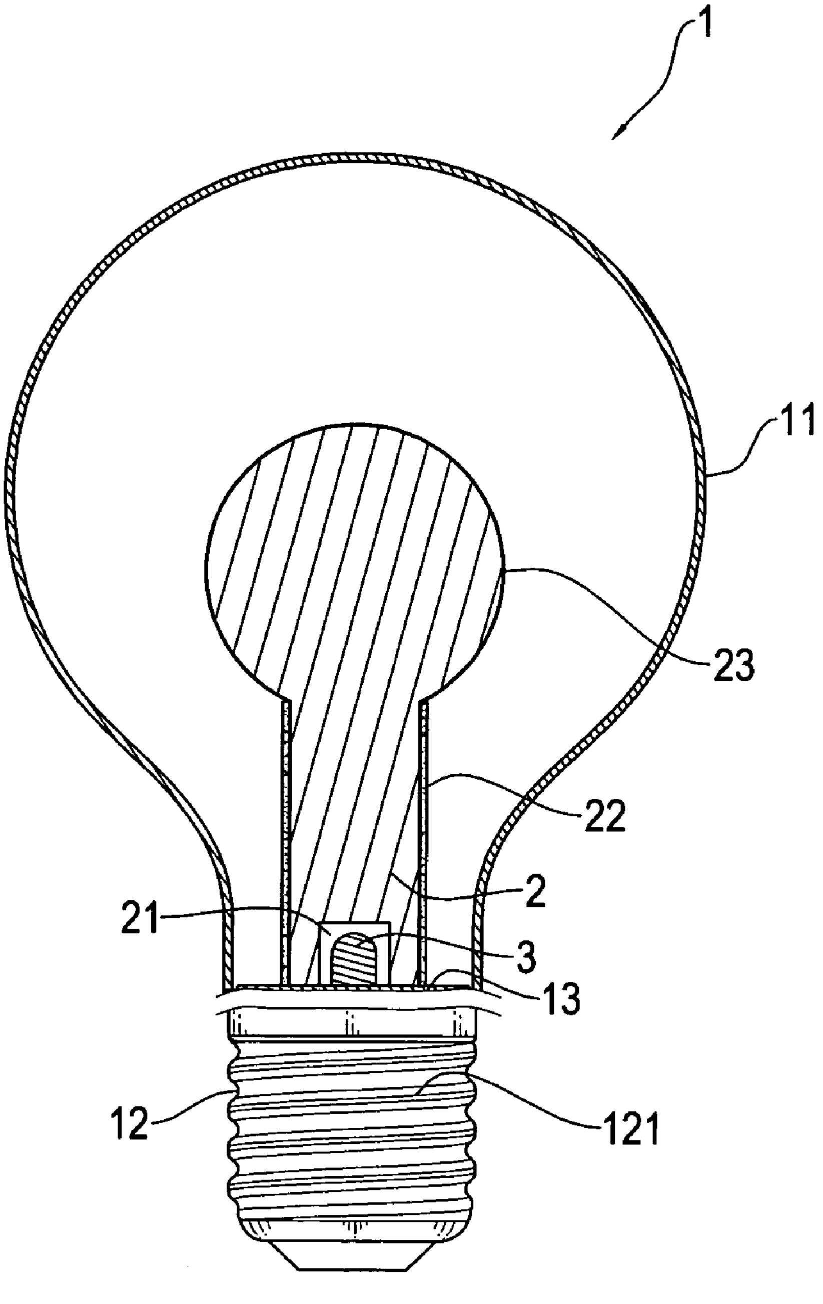
FIG. 2 is a cross-sectional view showing a light bulb constructed in accordance with a second embodiment of the present invention.

Referring to FIG. 2, which illustrates a cross-sectional view of a light bulb constructed in accordance with a second embodiment of the present invention, the light bulb of the second embodiment comprises a bulb body 1, a light guide 2, and at least one LED 3. The bulb body 1 and the LED 3 are substantially identical to the counterparts of the first embodiment discussed above so that repeated description will be omitted herein.

The light guide 2 is arranged in an interior space of the bulb body 1. The light guide 2 has an end forming a cavity 21 that receives the LED 3 therein, so that the light guide 2 is set erect on the base 12. The light guide 2 has an outer surface on which a light reflective layer 22 (that functions to reflect and guide the portions of the light from LED 3 that are projected toward the side surface of the light guide 2 so as to redirect the portions of the light toward a top end of the light guide 2) is formed to reflect the light. Further, the top end of the light guide 2 forms a sphere 23 (that functions to provide refractive surface areas of various angles for refracting and deflecting the light from the LED 3 and transmitting to the sphere 23 to project the light outward at various angles to thereby enhance the angular range of illumination) for deflecting the light. With such an arrangement, the light guide 2 guides the light emitting from the internal light source provided by the LED-3 toward the light-transmitting shell 11 to project the light outward through the shell 11.

Figure 3:
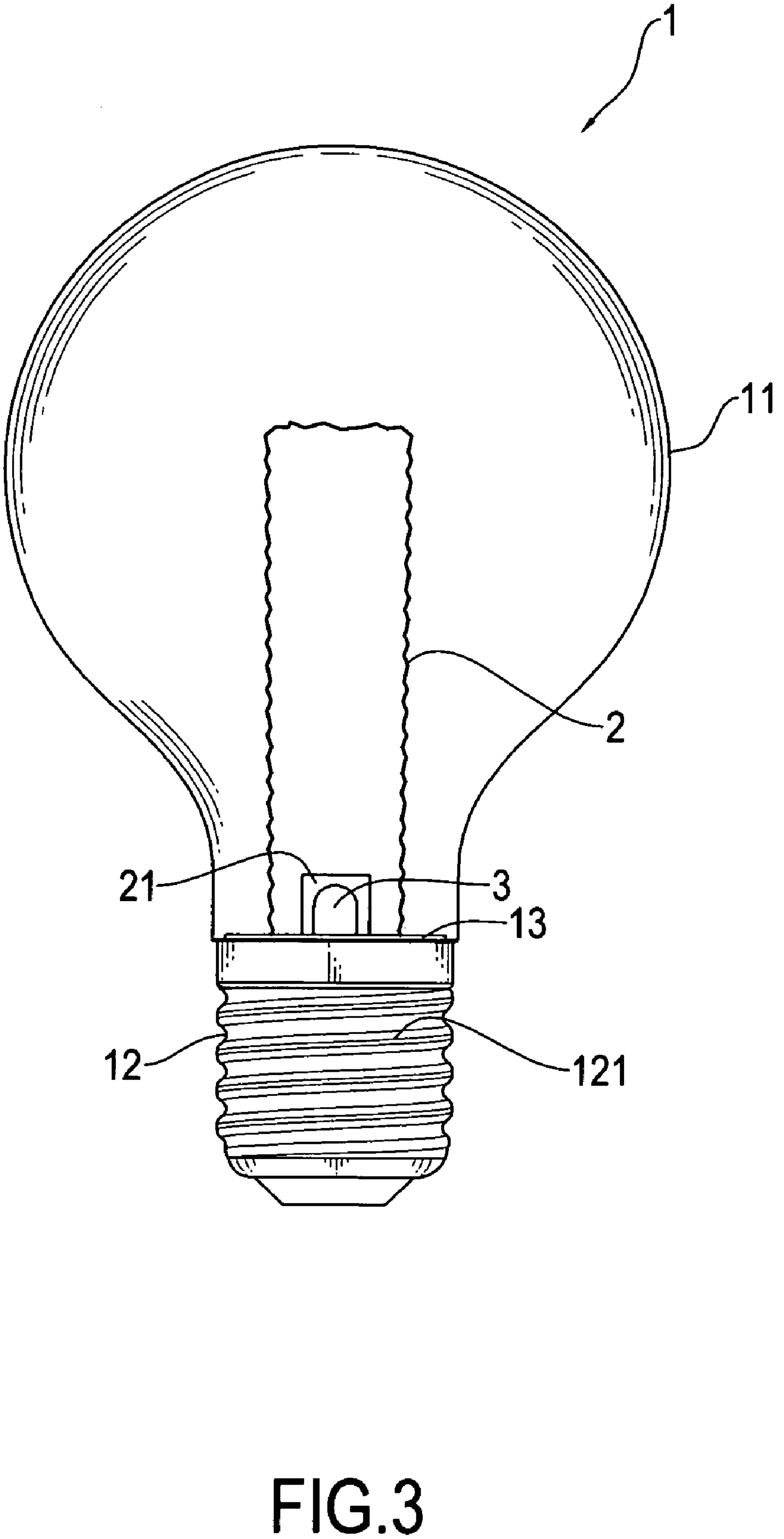
FIG. 3 is a side elevational view showing a light bulb constructed in accordance with a third embodiment of the present invention.

Referring to FIG. 3, which illustrates a side elevational view of a light bulb constructed in accordance with a third embodiment of the present invention, the light bulb of the third embodiment comprises a bulb body 1, a light guide 2, and at least one LED 3. The bulb body 1 and the LED 3 are substantially identical to the counterparts of the first embodiment discussed above so that repeated description will be omitted herein.

The light guide 2 is arranged in an interior space of the bulb body 1. The light guide 2 has an end forming a cavity 21 that receives the LED 3 therein, so that the light guide 2 is set erect on the base 12. The light guide 2 has an outer surface, which is roughened (so that when the light from the LED 3 is transmitted into the light guide 2, the light is subjected to refraction and thus change of illumination angle due to the roughened surface of the light guide 2 for projecting the light outward at various angles to thereby enhance the angular range of illumination) for refracting the light. With such an arrangement, the light guide 2 guides the light emitting from the internal light source provided by the LED 3 toward the light-transmitting shell 11 to project the light outward through the shell 11.

Figure 4:
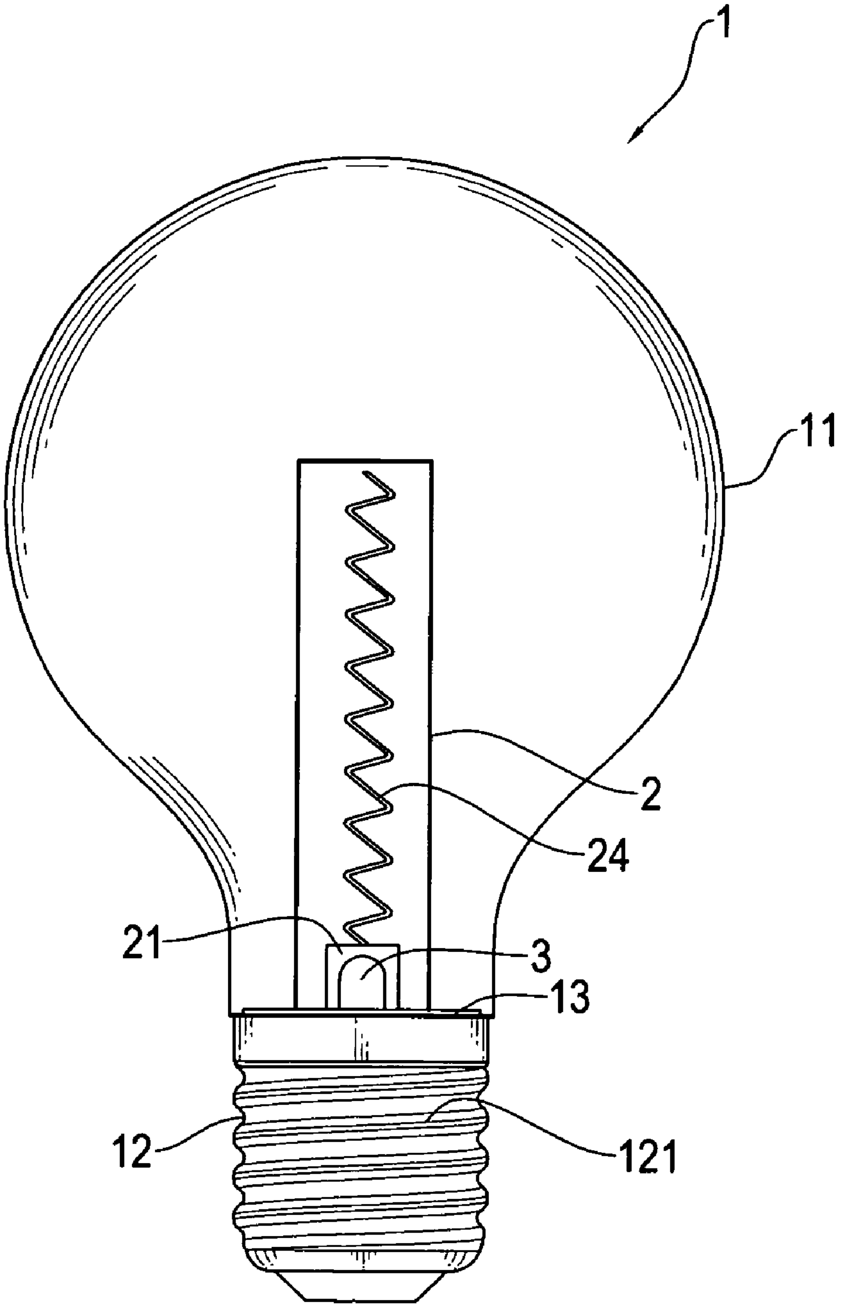
FIG. 4 is a side elevational view showing a light bulb constructed in accordance with a fourth embodiment of the present invention.

Referring to FIG. 4, which illustrates a side elevational view of a light bulb constructed in accordance with a fourth embodiment of the present invention, the light bulb of the fourth embodiment comprises a bulb body 1, a light guide 2, and at least one LED 3. The bulb body 1 and the LED 3 are substantially identical to the counterparts of the first embodiment discussed above so that repeated description will be omitted herein.

The light guide 2 is arranged in an interior space of the bulb body 1. The light guide 2 has an end forming a cavity 21 that receives the LED 3 therein, so that the light guide 2 is set erect on the base 12. The light guide 2 contains therein a light reflective layer 24 (that comprises a plurality of bends forming a plurality of light deflection faces so that when the light from the LED 3 is projected onto the reflective layer 24, the light is subjected to deflection by the deflection faces of the reflective layer 24 to change illumination angle thereof for being projected outward at various angles to thereby enhance the angular range of illumination) for deflecting the light. With such an arrangement, the light guide 2 guides the light emitting from the internal light source provided by the LED 3 toward the light-transmitting shell 11 to project the light outward through the shell 11.

Figure 5:
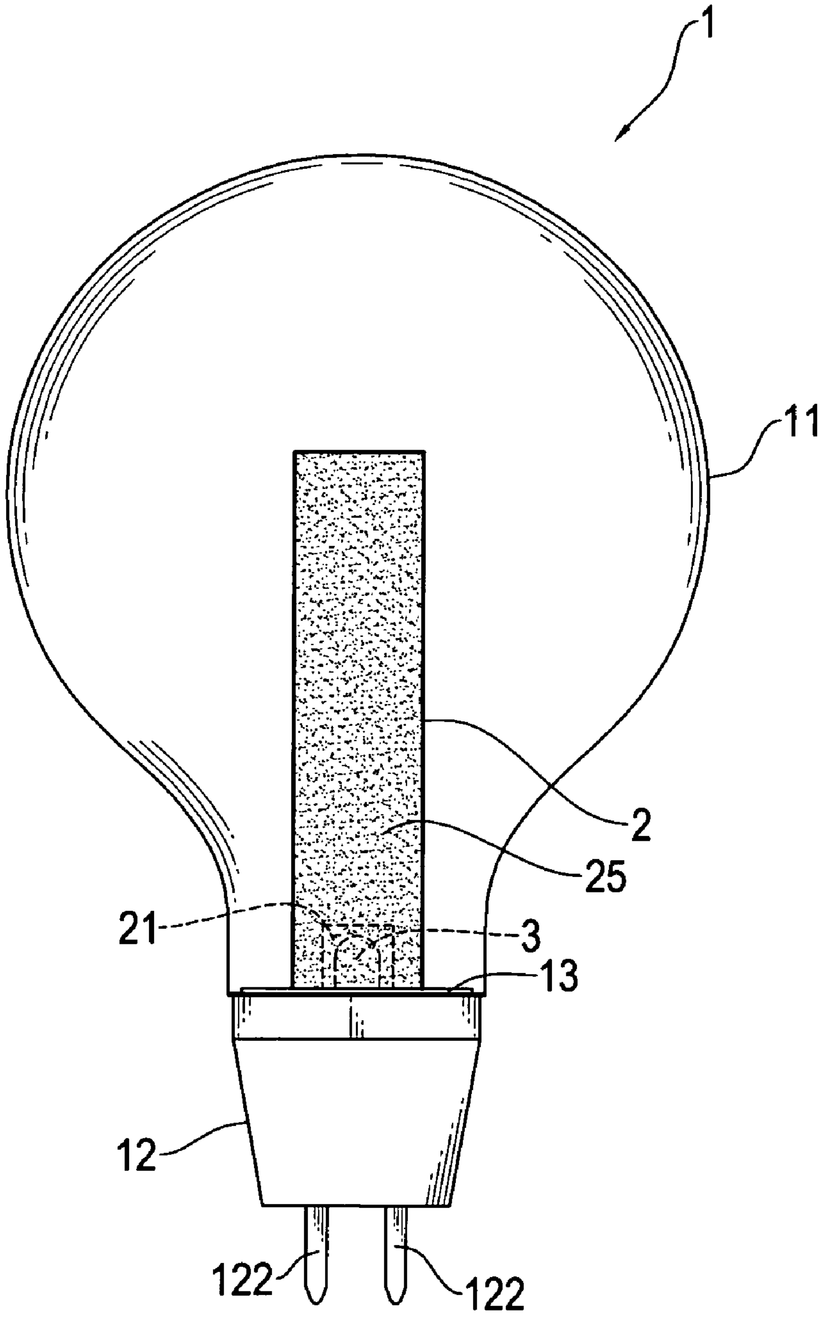
FIG. 5 is a side elevational view showing a light bulb constructed in accordance with a fifth embodiment of the present invention.

Referring to FIG. 5, which illustrates a side elevational view of a light bulb constructed in accordance with a fifth embodiment of the present invention, the light bulb of the fifth embodiment comprises a bulb body 1, a light guide 2, and at least one LED 3. The light guide 2 and the LED 3 are substantially identical to the counterparts of the first embodiment discussed above so that repeated description will be omitted herein.

The bulb body 1 comprises a light-transmitting material 11, preferably made in the form of a bulb shell, which in the embodiment illustrated comprises clear glass, but can alternatively be clear plastics, frosted glass, or frosted plastics, and an electrically conductive base 12, which in the embodiment illustrated comprises two electrically conductive terminals 122 mounted to an end face thereof for plugging into a socket of an external power source (not shown in the drawing) to establish electrical connection therebetween. The light-transmitting material or shell 11 is mounted to the base 12 in order to provide isolation of an internal light source (that is formed by the LED 3) from the surrounding for protection of the internal components, but allowing light to emit outward therethrough. The base 12 is coupled to the external socket 4 to receive electrical power therefrom. A circuit board 13 is fixed at one side (internal side) of the base 12 so that the circuit board 13 is in electrical connection with the base 12. Further, although in the second to fourth embodiments (see FIGS. 2-4) illustrated above, the bas 12 forms a helical conductive structure 121 for threading engagement and electrical coupling with the external socket 4, yet it is possible to replace such a helical conductive structure with two electrically conductive terminals 122 formed at an end face of the base 12 to plug into and selectively establish electrical connection with an external socket for providing the same function of electrical connection as the helical conductive structure.

In use, as shown in FIG. 6, the conductive base 12 of the bulb body 1 is coupled to the external socket 4 to receive and apply external power source to the circuit board 13. With the LED 3 electrically connected to the circuit board 13, the LED 3 is lit and gives off light to serve as an internal light source of the light bulb. The internal light source is projected into the light guide 2 and is deflected/refracted to further project outward at various angles, making the internal light source of the bulb body 1 emitting outward at a wide range and the light emitting from the bulb body 1 is of excellent brightness and features immediate lighting upon turning on and no flickering of light, which may impair eye vision of users. Compared to the conventional light bulbs, the light bulb of the present invention offers the advantage of long lifespan and eliminates the problem of high heat generation. Further, the LED 3 can be either a red LED, a blue LED, or a green LED, or any combination of these color LEDs, allowing the light emitting from the light bulb of the present invention to be of versatile colors, which cannot be heretofore realized with the conventional fluorescent lamps or incandescent lamps.

It is noted that besides being made of a material selected from clear glass, clear plastics, frosted glass, frosted plastics, and the likes, the light-transmitting shell 11 of the bulb body of the present invention can be further made with changes in outside appearance and configuration, such as having raised portions, printed strips/patterns, engraved patterns, and partially hollowed, to provide a decorative effect. The light guide 2 of the bulb of the present invention, besides functioning to guide light from the LED 3, can be modified in the outer shape or configuration thereof, such as being made as an animal figure, a fairy shape, or a Christmas tree shape, to provide a decorative effect. The light guide 2 may be further subjected to additional treatments, such as surface roughening, surface coating 22 of reflective materials, forming a top spherical end 23, incorporating reflectors 24 therein, to guide and redirect the light.

In all the embodiments discussed with reference to FIGS. 1-6, as well as alternatives, variations, and modifications thereof, diffusion powders 25 (see FIG. 5) can be selectively added in the light guide 2 to smoothen the light transmitting through and redirected by the light guide 2, whereby the light projecting from the light bulb is made softer.

The light bulb of the present invention features a light guide 2 arranged inside a bulb body 1 for guiding light from an internal light source provided by an LED 3 to increase the angular range of illumination thereby enhancing the practicability of the present invention. Further, the light guide 2 may be subjected to treatments to further increase the angular range of illumination thereby enhancing the versatility of the present invention. Further, the internal light source inside the bulb body 1 is provided by the LED 3, which features operation safety and extended lifespan thereby enhancing the practicability of the present invention. All these components can be assembled in a simple process and construct a simple structure, so that the manufacturing is easy and the costs reduced thereby enhancing the practicability of the present invention.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A light bulb, comprising:

a bulb body comprising a light-transmitting shell and a conductive base, the light-transmitting shell being mounted to the base, a circuit board being fixed to one side of the base and in electrical connection with the base;

at least one light-emitting diode mounted to the circuit board that is fixed at one side of the base, the at least one light-emitting diode being in electrical connection with the circuit board to provide an internal light source; and a light guide arranged inside the bulb body and having an end forming a cavity receiving the at least one light-emitting diode therein, the light guide being erected on the base and having an outer surface on which a reflective layer is formed to reflect light emitted from the light source, the light guide further having a top end forming a sphere for deflecting light emitted from the light source.

2. The light bulb as claimed in claim 1, wherein the light-transmitting shell is made of a material selected from a group consisting of clear glass, clear plastics, frosted glass, and frosted plastics.

3. The light bulb as claimed in claim 1, wherein the base has an outer surface forming a helical and electrically conductive configuration for threading engagement with a socket of an external power source to establish electrical connection therebetween.

4. The light bulb as claimed in claim 1, wherein the base has an outer surface forming a helical and electrically conductive configuration for threading engagement with a socket of an external power source to establish electrical connection therebetween.

5. The light bulb as claimed in claim 1, wherein the base has a face forming two conductive terminals for plugging into a socket of an external power source to establish electrical connection therebetween.

6. The light bulb as claimed in claim 1, wherein the base has a face forming two conductive terminals for plugging into a socket of an external power source to establish electrical connection therebetween.

7. The light bulb as claimed in claim 1, wherein the light guide contains therein diffusion powders for smoothening light emitting from the light source.

* * * * *